United States Patent
Lee et al.

(10) Patent No.: US 9,172,977 B2
(45) Date of Patent: Oct. 27, 2015

(54) FILTERING APPARATUS, METHOD, AND MEDIUM FOR MULTI-FORMAT CODEC

(75) Inventors: Sangjo Lee, Suwon-si (KR); Shihwa Lee, Seoul (KR); Jaesung Park, Busan-si (KR); Hyeyun Kim, Seongnam-si (KR); Jihun Kim, Suwon-si (KR); Hyeyeon Chung, Suwon-si (KR); Doohyun Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2704 days.

(21) Appl. No.: 11/449,589

(22) Filed: Jun. 9, 2006

(65) Prior Publication Data

US 2007/0076797 A1    Apr. 5, 2007

(30) Foreign Application Priority Data

Oct. 4, 2005    (KR) .......................... 10-2005-0093118

(51) Int. Cl.
| | |
|---|---|
| *H04N 7/12* | (2006.01) |
| *H04N 19/86* | (2014.01) |
| *H04N 19/139* | (2014.01) |
| *H04N 19/159* | (2014.01) |

(Continued)

(52) U.S. Cl.
CPC ............. *H04N 19/86* (2014.11); *H04N 19/117* (2014.11); *H04N 19/12* (2014.11); *H04N 19/137* (2014.11); *H04N 19/139* (2014.11); *H04N 19/159* (2014.11); *H04N 19/176* (2014.11); *H04N 19/44* (2014.11); *H04N 19/527* (2014.11); *H04N 19/61* (2014.11); *H01L 2924/0002* (2013.01)

(58) Field of Classification Search
None
See application file for complete search history.

(56) References Cited

U.S. PATENT DOCUMENTS

| | | | | |
|---|---|---|---|---|
| 7,397,853 | B2 * | 7/2008 | Kwon et al. | ............. 375/240.03 |
| 7,430,336 | B2 * | 9/2008 | Raveendran | .................. 382/268 |

(Continued)

FOREIGN PATENT DOCUMENTS

| | | |
|---|---|---|
| EP | 1 351 512 | 10/2003 |
| EP | 1 408 697 | 4/2004 |

(Continued)

OTHER PUBLICATIONS

Tsu-Ming Liu et al., "An Area-Efficient and High-Throughput De-Blocking Filter for Multi-Standard Video Applications", IEEE, Sep. 2005, pp. 1044-1047.

(Continued)

*Primary Examiner* — Nhon Diep
(74) *Attorney, Agent, or Firm* — Harness, Dickey & Pierce, P.L.C.

(57) ABSTRACT

Provided is a filtering apparatus, method, and medium for a multi-format codec, in which a blocking artifact of decoded video data is removed. The filtering apparatus includes a compression format detection unit, a block strength determination unit, a table determination unit, and a first filtering unit. The compression format detection unit detects a video compression format of the decoded video data. The block strength determination unit determines a block strength indicating a filtering strength with respect to the decoded video data according to the detected video compression format. The table determination unit determines a filtering table differently according to the block strength when the block strength is greater than a predetermined threshold. The first filtering unit performs filtering on the decoded video data in units of a block using the determined filtering table.

16 Claims, 8 Drawing Sheets

(51) Int. Cl.
*H04N 19/176* (2014.01)
*H04N 19/61* (2014.01)
*H04N 19/117* (2014.01)
*H04N 19/12* (2014.01)
*H04N 19/137* (2014.01)
*H04N 19/44* (2014.01)
*H04N 19/527* (2014.01)

(56) References Cited

U.S. PATENT DOCUMENTS

| | | | |
|---|---|---|---|
| 7,457,362 B2 * | 11/2008 | Sankaran | 375/240.24 |
| 7,574,060 B2 * | 8/2009 | Gambhire | 382/233 |
| 7,725,691 B2 * | 5/2010 | Stein et al. | 712/226 |
| 8,116,379 B2 * | 2/2012 | Dang | 375/240.24 |
| 2005/0013494 A1 | 1/2005 | Srinivasan et al. | |
| 2005/0053302 A1 | 3/2005 | Srinivasan et al. | |
| 2005/0117653 A1 | 6/2005 | Sankaran | |

FOREIGN PATENT DOCUMENTS

| | | |
|---|---|---|
| JP | H08-228353 A | 9/1996 |
| JP | H09-123337 A | 5/1997 |
| JP | 2003-152546 | 5/2003 |
| KR | 2000-0061566 A | 10/2000 |
| WO | 2004-051982 | 6/2004 |

OTHER PUBLICATIONS

Sridhar Srinivasan et al., Windows Media Video 9: Overview and Applications, Signal Processing Image Communication, vol. 19, Oct. 2004, pp. 851-875.

European Search Report dated Mar. 26, 2007.

"An area-efficient and high-throughput de-blocking filter for multi-standard video", IEEE International Conference on Image Processing, Sep. 2005, Liu et al.

Japanese Office Action dated Apr. 26, 2011, issued in Japanese Patent Application No. 2006-269571.

Joint Video Team (JVT) of ISO/IEC MPEG & ITU-T VCEG (ISO/IEC JTC1/SC29/WG11 and ITU-T SG16 Q.6). "Draft of Version 4 of H.264/AVC (ITU-T Recommendation H.264 and ISO/IEC 14496-10 (MPEG-4 part 10) Advanced Video Coding))". 14th Meeting: Hong Kong, CH, Jan. 18-21, 2005.

"WMV9 Compressed Video Bitstream Format and Decoding Process for Simple, Main and Advanced Profiles.".

* cited by examiner

FILTERING APPARATUS, METHOD, AND MEDIUM FOR MULTI-FORMAT CODEC

CROSS-REFERENCE TO RELATED APPLICATIONS

This application claims the benefit of Korean Patent Application No. 10-2005-0093118, filed on Oct. 4, 2005, in the Korean Intellectual Property Office, the disclosure of which is incorporated herein in its entirety by reference.

BACKGROUND OF THE INVENTION

1. Field of the Invention

The present invention relates to the decoding of a video, and more particularly, to a filtering apparatus, method, and medium for a multi-format codec (coder and decoder), which can be commonly used for various video compression formats to implement the multi-format codec.

2. Description of the Related Art

There are various video compression algorithms, i.e., video compression formats such as Windows® Media Video 9 (WMV-9) codec and H.264 codec (a digital video codec industry standard established by Video Coding Experts Group and Moving Pictures Expert Group). A detailed encoding/decoding algorithm varies from format to format. In general, a decoding algorithm suitable for a particular video compression format extracts a motion vector from a received bitstream, generates a current prediction frame using a reference frame that has been already reconstructed and the extracted motion vector, and reconstructs a current frame using the generated current prediction frame and residual data included in the bitstream.

A block boundary is visually distinguished in a digital video reproduced through decoding. This is called a blocking happening. A loop filter is used to reduce or remove the blocking happening. In other words, the loop filter is inserted into a decoding loop of a codec (coder and decoder) for deblocking. Moreover, in a currently required multi-codec decoder, i.e., a decoder supporting the video compression formats WMV-9 and H.264, developing a method for implementing a separate filtering process for each of the video compression formats increases the time and cost required for the development. Thus, there is a need to reduce the time and cost required for the development through filtering common to various video compression formats.

SUMMARY OF THE INVENTION

Additional aspects, features, and/or advantages of the invention will be set forth in part in the description which follows and, in part, will be apparent from the description, or may be learned by practice of the invention.

The present invention provides a filtering apparatus, method, and medium for a multi-format codec, which can be commonly used for various video compression formats to implement the multi-format codec.

According to one aspect of the present invention, there is provided a filtering apparatus for a multi-format codec. The filtering apparatus includes a compression format detection unit, a block strength determination unit, a table determination unit, and a first filtering unit. The compression format detection unit detects a video compression format of the decoded video data. The block strength determination unit determines a block strength indicating a filtering strength with respect to the decoded video data according to the detected video compression format. The table determination unit determines a filtering table differently according to the block strength when the block strength is greater than a predetermined threshold. The first filtering unit performs filtering on the decoded video data in units of a block using the determined filtering table.

The block strength determination unit may determine the block strength as being equal to or less than 4 when the detected video compression format is H.264, and the filtering apparatus may further include a second filtering unit performing predetermined filtering defined in H.264 when the block strength is less than 4.

The first filtering unit may include a table storage unit, a matrix calculation unit, a rounding control unit, and a shift operation unit. The table storage unit stores predetermined filtering tables. The matrix calculation unit reads-out a filtering table corresponding to table information determined by the table determination unit from the table storage unit and performs matrix calculation on the read-out filtering table and input data to be filtered. The rounding control unit adds a predetermined value to the matrix-calculated data. The shift operation unit shifts an output value of the rounding control unit by predetermined bits.

When the video compression format is H.264, the predetermined value added by the rounding control unit may be 4 and the predetermined bits shifted by the shift operation unit may be 3 bits.

The filtering tables may be in 8×8 matrix forms.

When the detected video compression format is WMV-9, the block strength determination unit determines the block strength as being equal to 5.

According to another aspect of the present invention, there is provided a filtering method for a multi-format codec, which removes a blocking happening of decoded video data. The filtering method includes detecting a video compression format of the decoded video data, determining a block strength indicating a filtering strength with respect to the decoded video data according to the detected video compression format, determining a filtering table differently according to the block strength when the block strength is greater than a predetermined threshold, and performing filtering on the decoded video data in units of a block using the determined filtering table.

According to another aspect of the present invention, there is provided an apparatus for a multi-format codec for deblocking decoded video data, the apparatus may include a compression format detection unit detecting a video compression format of the decoded video data; a block strength determination unit determining a block strength indicating a filtering strength with respect to the decoded video data according to the detected video compression format; and a table determination unit determining a filtering table differently according to the block strength when the block strength is greater than a predetermined threshold.

The apparatus may further include a first filtering unit performing filtering on the decoded video data in units of a block using the determined filtering table when the block strength is greater than or equal to 4 to deblock the decoded video data.

The first filtering unit may further include a table storage unit storing predetermined filtering tables; a matrix calculation unit reading-out a filtering table corresponding to table information determined by the table determination unit from the table storage unit and performing matrix calculation on the read-out filtering table and input data to be filtered; a rounding control unit adding a predetermined value to the matrix-calculated data; and a shift operation unit shifting an output value of the rounding control unit by predetermined bits.

The apparatus may further include a second filtering unit performing predetermined filtering defined in H.264 when the block strength is less than 4 to deblock the decoded video data.

According to another aspect of the present invention, there is provided a method for a multi-format codec for deblocking decoded video data, the method may include detecting a video compression format of the decoded video data; determining a block strength indicating a filtering strength with respect to the decoded video data according to the detected video compression format; and determining a filtering table differently according to the block strength when the block strength is greater than a predetermined threshold.

The method may further include performing filtering on the decoded video data in units of a block using the determined filtering table when the block strength is greater than or equal to 4 to deblock the decoded video data.

The method may further include performing predetermined filtering defined in H.264 when the block strength is less than 4 to deblock the decoded video data.

The method may further include performing filtering on the decoded video data in units of a block using the determined filtering table to deblock the decoded video data.

The method of performing of the filtering may include performing matrix calculation on a table corresponding to the determined table information and input data to be filtered; adding a predetermined value to the matrix-calculated data; and shifting an output value of the rounding control unit by predetermined bits According to another aspect of the present invention, there is provided at least one computer readable medium storing instructions that control at least one processor to perform a method for a multi-format codec for deblocking decoded video data, the method may further include detecting a video compression format of the decoded video data; determining a block strength indicating a filtering strength with respect to the decoded video data according to the detected video compression format; and determining a filtering table differently according to the block strength when the block strength is greater than a predetermined threshold.

BRIEF DESCRIPTION OF THE DRAWINGS

These and/or other aspects, features, and advantages of the invention will become apparent and more readily appreciated from the following description of exemplary embodiments, taken in conjunction with the accompanying drawings of which.

DETAILED DESCRIPTION OF THE PREFERRED EMBODIMENTS

Reference will now be made in detail to exemplary embodiments of the present invention, examples of which are illustrated in the accompanying drawings, wherein like reference numerals refer to the like elements throughout. Exemplary embodiments are described below to explain the present invention by referring to the figures.

Figure 1:
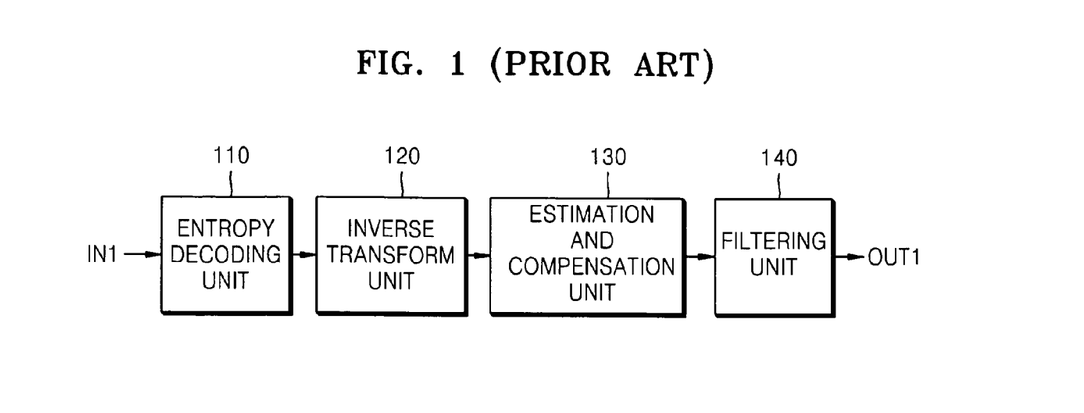
FIG. 1 is a block diagram of a general video decoder.

FIG. 1 is a block diagram of a general video decoder. The video decoder includes an entropy decoding unit 110, an inverse transform unit 120, an estimation and compensation unit 130, and a filtering unit 140.

The entropy decoding unit 110 performs entropy decoding on an input bitstream IN2 to reconstruct quantization coefficients and various parameters. The inverse transform unit 120 performs inverse quantization on the quantization coefficients and performs inverse integer transform and performs inverse spatial transform such as inverse discrete cosine transform (IDCT). The estimation and compensation unit 130 reconstructs a video by performing temporal/spatial estimation and screen difference in unit of a block compensation in an inter mode or an intra mode. At this time, screen difference in unit of a block, i.e., a blocking happening, occurs at a boundary between blocks in the reconstructed video. The filtering unit 140 performs filtering on the reconstructed video, thereby deblocking and outputting filtered video data OUT1. Since the blocking happening occurs due to compression in units of a block of a predetermined size, edge filtering of the filtering unit 140 is also performed in units of a macroblock.

Next, filtering orders in H.264 and WMV-9 will be described.

Figure 2:
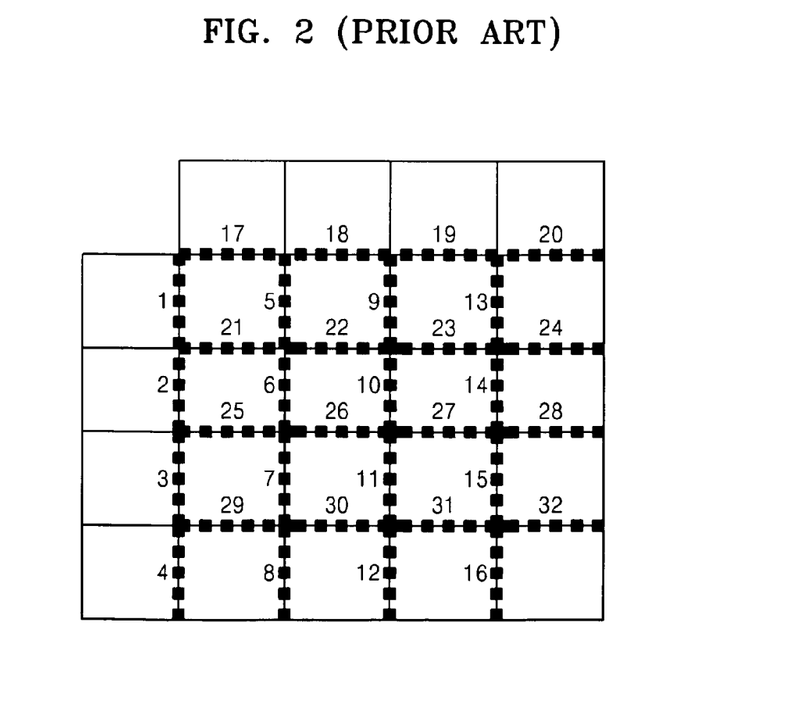
FIG. 2 illustrates the filtering order of edges in a macroblock according to H.264.

FIG. 2 illustrates the filtering order of edges in a macroblock in H.264.

Referring to FIG. 2, filtering is performed in units of a 4×4 block in H.264. After filtering is performed on vertical boundaries in order of 1, 2, 3, then 4, filtering is performed on horizontal boundaries.

Figure 3A:
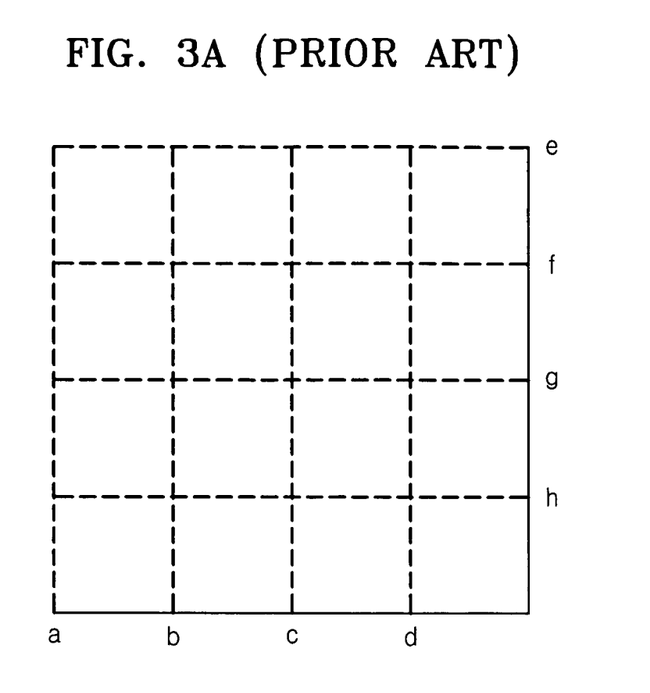
FIGS. 3A and 3B illustrate filtering orders of edges of a luminance component and a chrominance component in a macroblock.
Figure 3B:
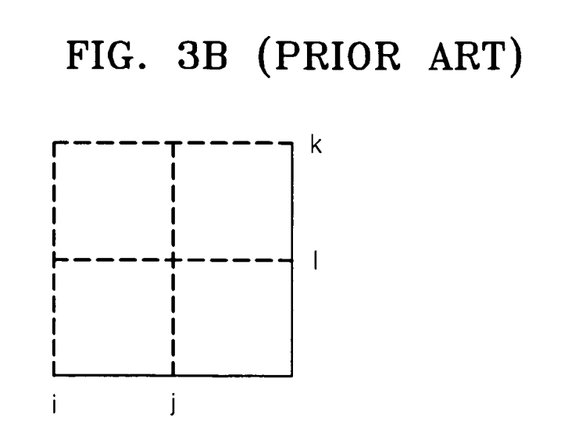

FIGS. 3A and 3B illustrate filtering orders of edges of a luminance component and a chrominance component in a macroblock.

Referring to FIGS. 3A and 3B, filtering with respect to a macroblock is performed on a luminance component and a chrominance component of a pixel in the macroblock. FIG. 3A illustrates filtering domains of boundaries for a luminance component and FIG. 3B illustrates filtering domains of boundaries for a chrominance component. Filtering with respect to the luminance component is performed on vertical boundaries in order of a, b, c, then d and is performed on horizontal boundaries in order of e, f, g, then h. Filtering with respect to the chrominance component is performed on vertical boundaries in order of i then j and is performed on horizontal boundaries in order of k then l. In general, filtering with respect to the chrominance component is performed after filtering with respect to the luminance component.

Figure 4A:
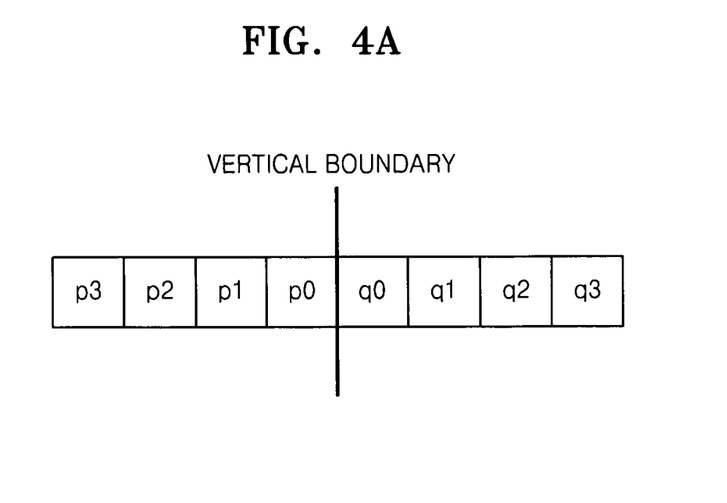
FIGS. 4A and 4B illustrate positions of pixels around a vertical boundary and a horizontal boundary in filtering.
Figure 4B:
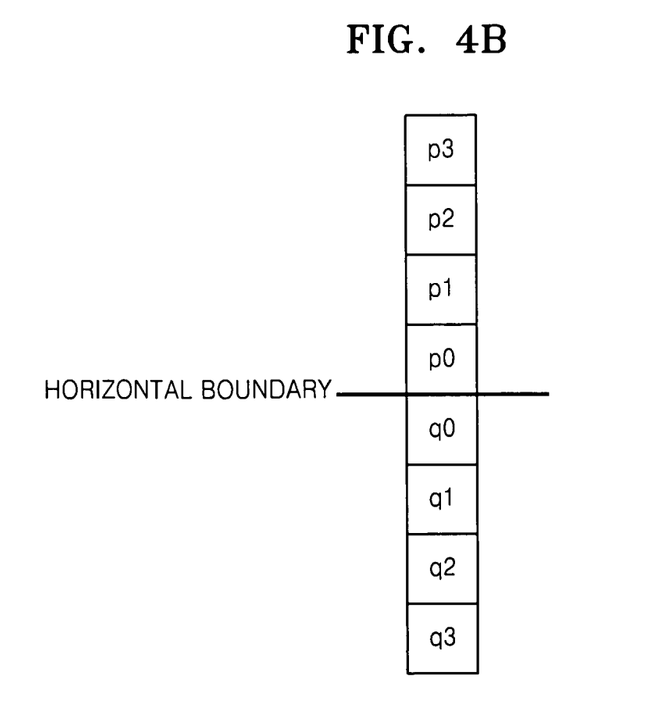

FIGS. 4A and 4B illustrate positions of pixels around each vertical domain of boundary and each horizontal domain of boundary in filtering.

Referring to FIGS. 4A and 4B, four pixels at each of both sides of a boundary are required to perform filtering calculation. In other words, to perform filtering, four pixels p3, p2, p1, and p0 are required on the left side of a vertical boundary and four pixels q0, q1, q2, and q3 are required on the right side of the vertical boundary. Four pixels p3, p2, p1, and p0 are required above a horizontal boundary and four pixels q0, q1, q2, and q3 are required below the horizontal boundary. The number of pixels to be corrected and a filtering strength to be applied vary with a quantization parameter used in a macroblock including adjacent 4×4 blocks, an encoding mode of a neighboring clock, and a motion vector.

Figure 5:
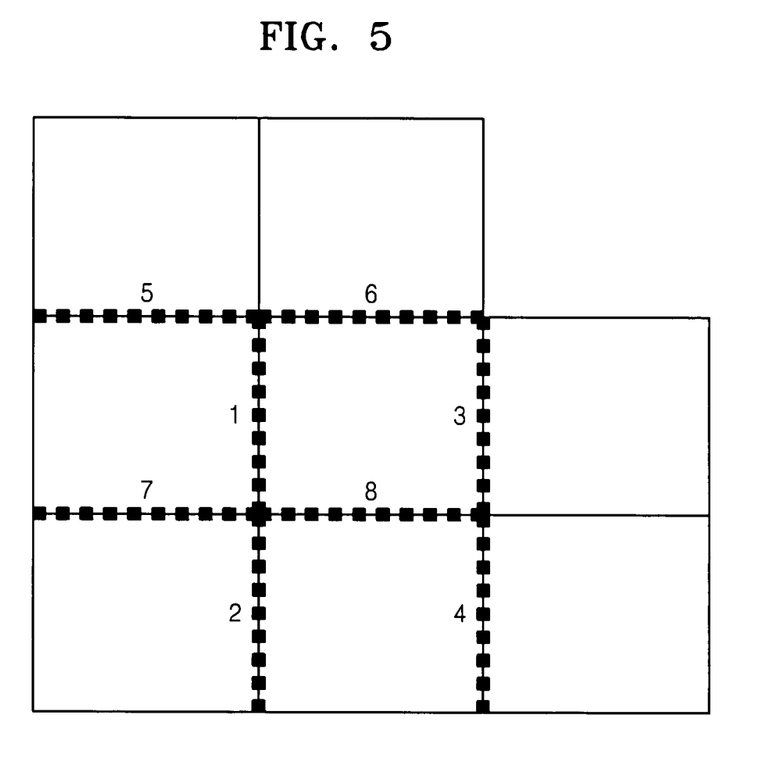
FIG. 5 illustrates the filtering order of edges in a macroblock in WMV-9.

FIG. 5 illustrates the filtering order of each edge in a macroblock in WMV-9.

Referring to FIG. 5, filtering is performed in units of an 8×8 block in WMV-9. After filtering is sequentially performed on vertical boundaries, filtering is sequentially performed on horizontal boundaries. In WMV-9, filtering is performed only on boundaries of blocks encoded in an intra mode and is performed only when a picture level quantization step size (PQUANT) parameter is greater than 9.

A filtering apparatus for a multi-format codec according to an exemplary embodiment of the present invention will now be described.

Figure 6:
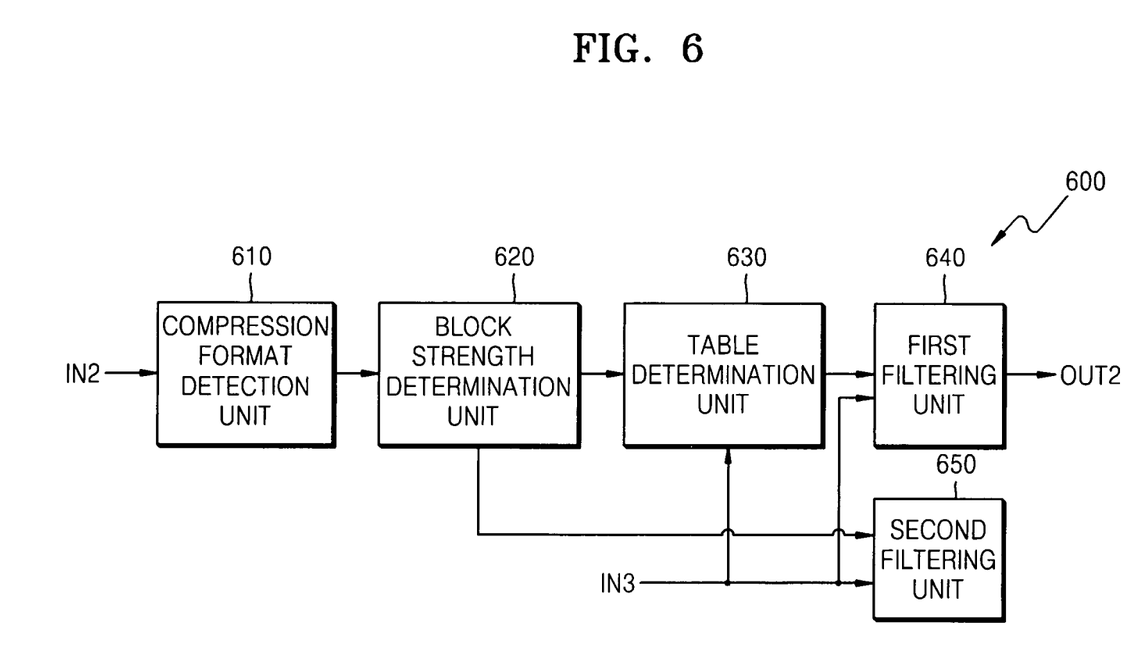
FIG. 6 is a block diagram of a filtering apparatus for a multi-format codec according to an exemplary embodiment of the present invention.

FIG. 6 is a block diagram of a filtering apparatus 600 for a multi-format codec according to an exemplary embodiment of the present invention.

Referring to FIG. 6, the filtering apparatus 600 includes a compression format detection unit 610, a block strength determination unit 620, a table determination unit 630, a first filtering unit 640, and a second filtering unit 650.

IN2 indicates data including various parameters among data input to the filtering apparatus 600 and IN3 indicates reconstructed video data.

The compression format detection unit 610 detects the video compression format of video data. The compression format detection unit 610 can detect whether the video compression format of the video data is H.264 or WMV-9 by checking a parameter Codec_type, which indicates the video compression format of the video data from data IN 2. While the video compression format is H.264 or WMV-9 in an exemplary embodiment of the present invention, it may be another video compression format without being limited to H.264 and WMV-9. In addition, although detecting one of two different compression formats is discussed in an exemplary embodiment of the present invention, other exemplary embodiments of the present invention include detecting one compression format among more than two different compression formats, e.g. many different compression formats.

The block strength determination unit 620 determines a block strength indicating a filtering strength of the input video data according to the detected video compression format.

The block strength is used in H.264 and is also called a boundary strength (BS). The BS changes according to prediction modes of two blocks, a motion difference between the two blocks, and the existence of encoded residual.

| Condition | BS |
|---|---|
| When p and/or q are(is) intra-coded and a boundary is between macroblocks | 4 |
| When p and q are intra-coded and a boundary is not between macroblocks | 3 |
| When p or q is not intra-coded and p and q include a coded coefficient | 2 |

-continued

| Condition | BS |
|---|---|
| When p or q is not intra-coded, p or q does not include a coded coefficient, p and q use different reference frames or different numbers of reference frames, or motion vectors of one or more luminance sample are different | 1 |
| Other | 0 |

In Table 1, each condition may be checked sequentially from top to bottom until one of the conditions is satisfied, and a value corresponding to the satisfied condition is determined to be a BS. When the BS is 0, it means that filtering is not to be performed.

When the block strength determination unit 620 determines that the BS is less than 4, the second filtering unit 650 performs filtering unique to H.264.

When the video compression format is WMV-9, the block strength determination unit 620 determines the BS as 5 to distinguish WMV-9 from H.264.

When the BS is greater than a predetermined threshold, the table determination unit 630 determines a filtering table differently according to the BS.

If the video compression format is H.264, filtering tables are determined for four modes according to whether the following conditions are satisfied in case of the BS being 4. Division into the four modes according to whether those conditions are satisfied is suggested in the H.264 AVC standard. Among those conditions, a first condition is as follows:

$$\alpha_p < \beta \&\& ABS(p_0 - q_0) < (\alpha >> 2) + 2 \quad (1)$$

where ABS is an operator indicating an absolute value, $\alpha$ and $\beta$ indicates thresholds defined in the H.264 AVC standard and increase with an average of quantization parameters (QP) of two blocks p and q, and $\alpha_p$ is as follows:

$$\alpha_p < ABS(p_2 - p_0) \quad (2),$$

A second condition is as follows:

$$\alpha_p < \&\& ABS(p_0 - q_0) < (\alpha >> 2) + 2 \quad (3),$$

where $\alpha_p$ is as follows:

$$\alpha_p < ABS(q_2 - q_0) \quad (4)$$

The four modes are obtained according to combinations of the first condition and the second condition.

The first filtering unit 640 performs filtering in units of a block of the decoded video data IN3 using the determined filtering table. Filtering performed by the first filtering unit 640 can be expressed as follows:

$$Out = (In * T_n + R) >> 3 \quad (5),$$

where Out and In indicates 8×8 matrices, Tn indicates a filtering table, and R indicates a matrix having round values.

In H.264, when the BS is 4, the four modes are obtained according to the first condition and the second condition. The filtering table Tn according to the four modes is in an 8×8 matrix form.

A filtering table $T_0$ according to mode 0 satisfying both the first condition and the second condition is as follows:

$$[8, 2, 0, 0, 0, 0, 0, 0] \quad (6)$$

$$[0, 3, 2, 1, 0, 0, 0, 0]$$

$$[0, 1, 2, 2, 1, 0, 0, 0]$$

$$[0, 1, 2, 2, 2, 2, 1, 0]$$

[0, 1, 2, 2, 2, 2, 1, 0]
[0, 0, 0, 1, 2, 2, 1, 0]
[0, 0, 0, 0, 1, 2, 3, 0]
[0, 0, 0, 0, 0, 0, 2, 8]

A filtering table $T_1$ according to mode 1 satisfying only the first condition is as follows:

$$[8, 2, 0, 0, 0, 0, 0, 0] \quad (7)$$
$$[0, 3, 2, 1, 0, 0, 0, 0]$$
$$[0, 1, 2, 2, 2, 0, 0, 0]$$
$$[0, 1, 2, 2, 0, 0, 0, 0]$$
$$[0, 1, 2, 2, 2, 0, 0, 0]$$
$$[0, 0, 0, 1, 4, 8, 0, 0]$$
$$[0, 0, 0, 0, 0, 0, 8, 0]$$
$$[0, 0, 0, 0, 0, 0, 0, 8]$$

A filtering table $T_2$ according to mode 2 satisfying only the second condition is as follows:

$$[8, 0, 0, 0, 0, 0, 0, 0] \quad (8)$$
$$[0, 8, 0, 0, 0, 0, 0, 0]$$
$$[0, 0, 8, 4, 1, 0, 0, 0]$$
$$[0, 0, 0, 2, 2, 2, 1, 0]$$
$$[0, 0, 0, 0, 2, 2, 1, 0]$$
$$[0, 0, 0, 2, 2, 2, 1, 0]$$
$$[0, 0, 0, 0, 1, 2, 3, 0]$$
$$[0, 0, 0, 0, 0, 0, 2, 8]$$

A filtering table $T_3$ according to mode 3 satisfying neither the first condition nor the second condition is as follows:

$$[8, 0, 0, 0, 0, 0, 0, 0] \quad (9)$$
$$[0, 8, 0, 0, 0, 0, 0, 0]$$
$$[0, 0, 8, 4, 2, 0, 0, 0]$$
$$[0, 0, 0, 2, 0, 0, 0, 0]$$
$$[0, 0, 0, 0, 2, 0, 0, 0]$$
$$[0, 0, 0, 2, 4, 8, 0, 0]$$
$$[0, 0, 0, 0, 0, 0, 8, 0]$$
$$[0, 0, 0, 0, 0, 0, 0, 8]$$

If the video compression format is WMV-9, the BS equals 5, and a filtering table $T_4$ is used. A filtering table $T_4$ according to WMV-9 is as follows:

$$[0, 0, 0, 0, 0, 0, 0, 0] \quad (10)$$
$$[0, 0, 0, 0, 0, 0, 0, 0]$$
$$[0, 0, 7, -1, 1, 1, 0, 0]$$
$$[0, 0, 0, 7, 1, 0, 0, 0]$$
$$[0, 0, 0, 1, 7, 0, 0, 0]$$
$$[0, 0, 1, 1, -1, 7, 0, 0]$$
$$[0, 0, 0, 0, 0, 0, 0, 0]$$
$$[0, 0, 0, 0, 0, 0, 0, 0]$$

The second filtering unit 650 performs filtering unique to H.264 in case of the BS less than 4. Filtering unique to H.264 in case of the BS less than 4 is performed according to the H.264 AVC standard.

Figure 7:
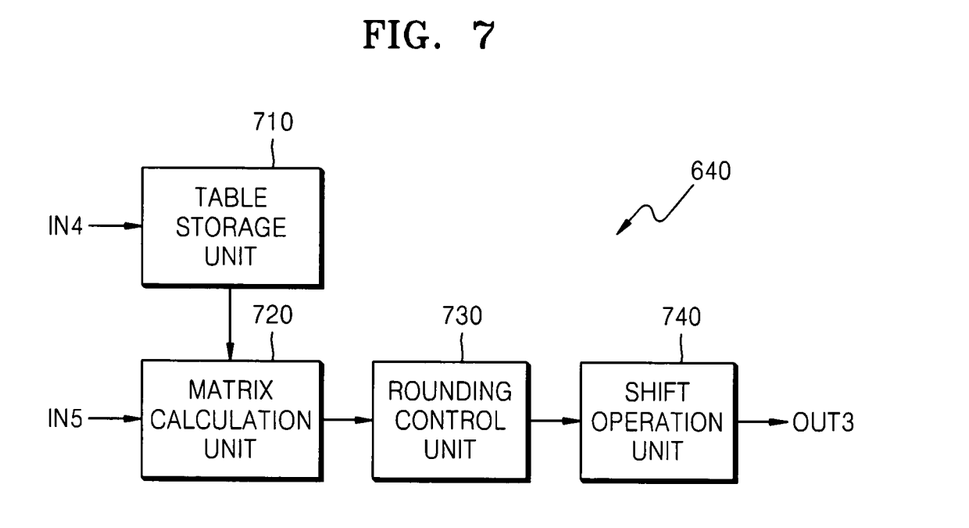
FIG. 7 is a detailed block diagram of a first filtering unit of FIG. 6.

FIG. 7 is a detailed block diagram of the first filtering unit 640.

Referring to FIG. 7, the first filtering unit 640 includes a table storage unit 710, a matrix calculation unit 720, a rounding control unit 730, and a shift operation unit 740.

The table storage unit 710 stores filtering tables according to H.264 in case of the BS being 4 and according to WMV-9. The table storage unit 710 outputs filtering tables corresponding to table information IN4 from the table determination unit 630 to the matrix calculation unit 720.

The matrix calculation unit 720 reads-out a filtering table corresponding to table information determined by the table determination unit 630 from the table storage unit 710 and performs matrix calculation on the read-out filtering table and input data IN5 to be filtered.

The rounding control unit 730 adds a predetermined value to the matrix-calculated data. R in Equation (5) is the predetermined value. In the case of BS being 4 in H.264, the predetermined value is 4. In WMV-9, the predetermined value is 3 or 4.

The shift operation unit 740 shifts an output value of the rounding control unit 730 by predetermined bits. As in Equation (5), the predetermined bits are 3 bits. As a result of the shift operation of the shift operation unit 740, filtered data OUT3 is output.

Figure 8A:
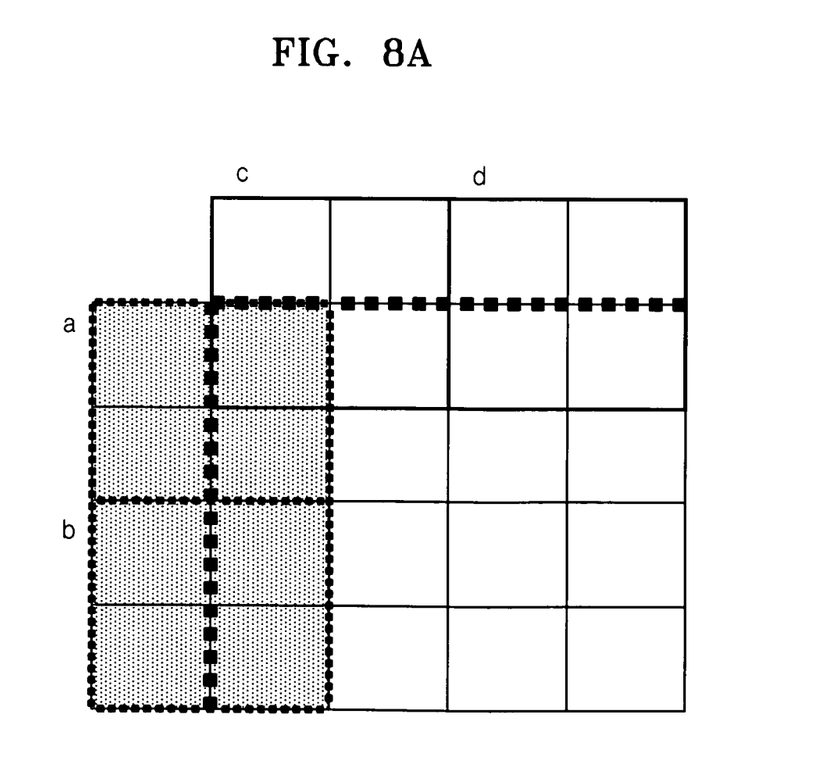
FIGS. 8A and 8B illustrate filtering regions in H.264 and WMV-9.
Figure 8B:
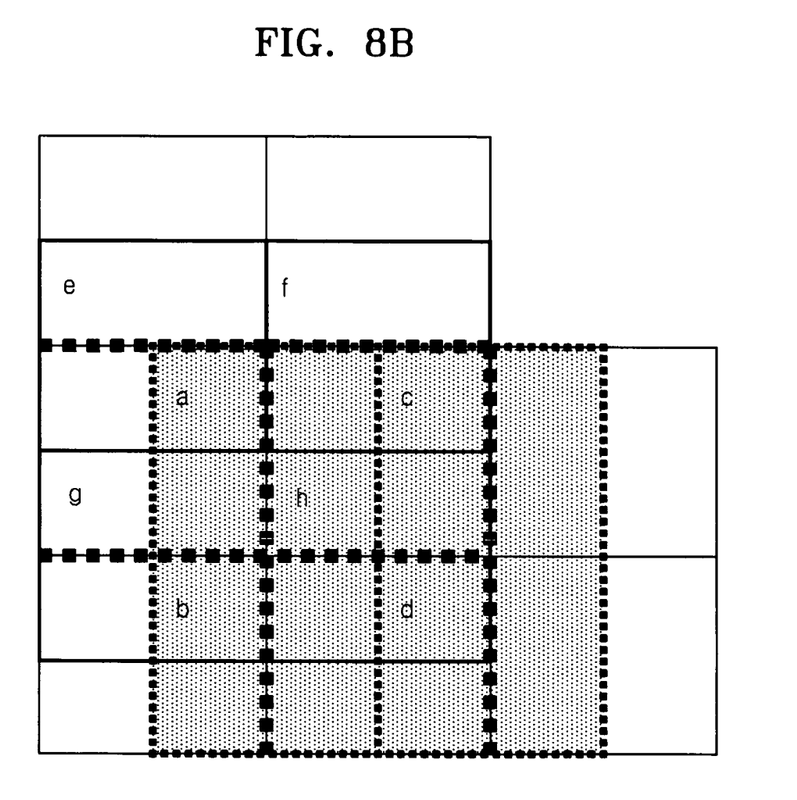

FIGS. 8A and 8B illustrate filtering regions in H.264 and WMV-9.

Referring to FIG. 8A, in case of the BS being 4 in H.264, filtering is performed on regions a, b, c, and d in units of an 8×8 block. Referring to FIG. 8B, in WMV-9, filtering is performed on regions a, b, c, d, e, f, g, and h in units of an 8×8 block. In both H.264 and WMV-9, filtering is performed on horizontal boundaries after filtering on vertical boundaries.

Figure 9:
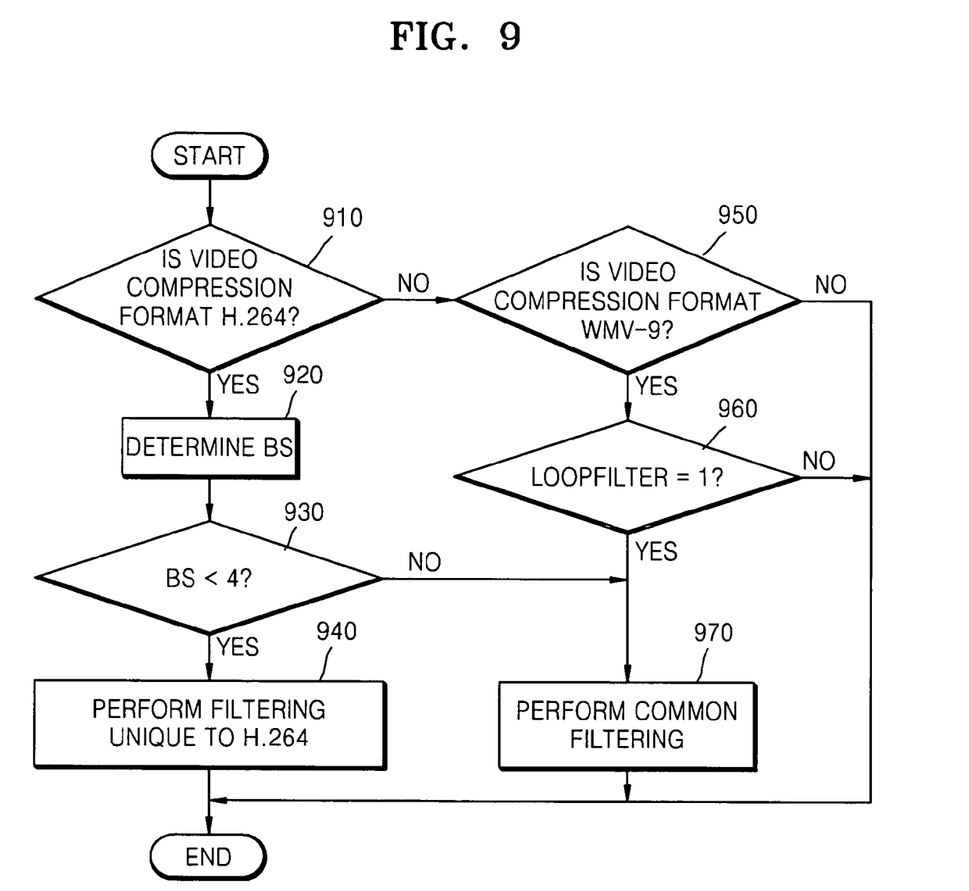
FIG. 9 is a flowchart illustrating a filtering method for a multi-format codec according to an exemplary embodiment of the present invention.

FIG. 9 is a flowchart illustrating a filtering method for a multi-format codec according to an exemplary embodiment of the present invention.

Referring to FIG. 9, the video compression format of decoded video data is detected to determine whether the video compression format is H.264 in operation 910. If the video compression format is H.264, a BS is determined according to prediction modes of two blocks p and q, a motion difference between the two blocks p and q, and the existence of encoded residual in operation 920. It is determined whether the BS is equal to or less than 4 in operation 930. If the BS is less than 4, filtering unique to H.264 is performed in operation 940. If the BS is equal to 4, a process goes to operation 970 to perform common filtering according to a filtering table.

If the video compression format is not H.264 in operation 910, it is determined whether the video compression format is WMV-9 in operation 950. If the video compression format is WMV-9, it is determined whether one of sequence parameters of input data, i.e., LOOPFILTER, is set to 1 in operation 960. LOOPFILTER is a parameter indicating whether to filter WMV-9 video data. If LOOPFILTER is set to 1, common filtering is performed according to a filtering table in operation 970.

According to the present invention, a common module capable of performing common filtering on encoded video data is used according to video compression formats such as H.264 and WMV-9, contributing to a reduction in the logic size of hardware or the code size of software. Moreover, by using a filtering method common to H.264 and WMV-9, the time and cost required for development can be reduced.

In addition to the above-described exemplary embodiments, exemplary embodiments of the present invention can also be implemented by executing computer readable code/instructions in/on a medium, e.g., a computer readable medium. The medium can correspond to any medium/media permitting the storing and/or transmission of the computer readable code.

The computer readable code/instructions can be recorded/transferred in/on a medium in a variety of ways, with examples of the medium including magnetic storage media (e.g., floppy disks, hard disks, magnetic tapes, etc.), optical recording media (e.g., CD-ROMs, or DVDs), magneto-optical media (e.g., floptical disks), hardware storage devices (e.g., read only memory media, random access memory media, flash memories, etc.) and storage/transmission media such as carrier waves transmitting signals, which may include instructions, data structures, etc. Examples of storage/transmission media may include wired and/or wireless transmission (such as transmission through the Internet). Examples of wired storage/transmission media may include optical wires and metallic wires. The medium/media may also be a distributed network, so that the computer readable code/instructions is stored/transferred and executed in a distributed fashion. The computer readable code/instructions may be executed by one or more processors.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A filtering apparatus for a multi-format codec, which removes a blocking happening of decoded video data, the filtering apparatus comprising:
    a compression format detection unit to detect a video compression format of the decoded video data;
    a block strength determination unit to determine a block strength indicating a filtering strength as being equal to or less than a first value when the detected video compression format is a first compression format, and as being greater than the first value when the detected video compression format is different from the first compression format;
    a table determination unit to determine a filtering table differently when the block strength is equal to or greater than-4 the first value; and
    a first filtering unit to perform filtering on the decoded video data in units of a block using the determined filtering table when the block strength is equal to or greater than the first value.

2. The filtering apparatus of claim 1, wherein the first value is 4, if the first compression format is H.264, and further comprising a second filtering unit performing predetermined filtering defined in H.264 when the block strength is less than 4.

3. The filtering apparatus of claim 1, wherein the first filtering unit comprises:
    a table storage unit to store predetermined filtering tables;
    a matrix calculation unit to read-out a filtering table corresponding to table information determined by the table determination unit from the table storage unit and to perform matrix calculation on the read-out filtering table and input data to be filtered;
    a rounding control unit to add a predetermined value to the matrix-calculated data; and
    a shift operation unit to shift an output value of the rounding control unit by predetermined bits.

4. The filtering apparatus of claim 3, wherein when the video compression format is H.264, the predetermined value added by the rounding control unit is 4 and the predetermined bits shifted by the shift operation unit are 3 bits.

5. The filtering apparatus of claim 3, wherein the filtering tables are in 8×8 matrix forms.

6. The filtering apparatus of claim 1, wherein the block strength determination unit determines the block strength as being equal to 5 when the detected video compression format is WMV-9.

7. A filtering method for a multi-format codec, which removes a blocking happening of decoded video data, the filtering method comprising:
    detecting a video compression format of the decoded video data;
    determining a block strength indicating a filtering strength as being equal to or less than a first value when the detected video compression format is a first compression format, and as being greater than the first value when the detected video compression format is different from the first compression format;
    determining a filtering table differently when the block strength is equal to or greater than the first value; and
    performing filtering on the decoded video data in units of a block using the determined filtering table when the block strength is equal to or greater than the first value.

8. The filtering method of claim 7, wherein the first value is 4, if the first compression format is H.264, and further comprising performing predetermined filtering defined in H.264 when the block strength is less than 4.

9. The filtering method of claim 7, wherein the performing of the filtering comprises:
    performing matrix calculation on a table corresponding to the determined table information and input data to be filtered;
    adding a predetermined value to the matrix-calculated data; and
    shifting an output value of the rounding control unit by predetermined bits.

10. The filtering method of claim 9, wherein the filtering tables are in 8×8 matrix forms.

11. A non-transitory computer-readable recording medium having recorded thereon a program for implementing a filtering method for a multi-format codec, which removes a blocking happening of decoded video data, the filtering method comprising:
    detecting a video compression format of the decoded video data;
    determining a block strength indicating a filtering strength as being equal to or less than a first value when the detected video compression format is a first compression format, and as being greater than the first value when the detected video compression format is different from the first compression format;

determining a filtering table differently when the block strength is equal to or greater than the first value; and performing filtering on the decoded video data in units of a block using the determined filtering table when the block strength is equal to or greater than the first value.

12. An apparatus for a multi-format codec for deblocking decoded video data, the apparatus comprising:

a compression format detection unit to detect a video compression format of the decoded video data;

a block strength determination unit to determine a block strength indicating a filtering strength as being equal to or less than 4 when the detected video compression format is H.264, and as being equal to 5 when the detected video compression format is WMV-9; and a table determination to determine a filtering table differently when the block strength is greater than or equal to 4.

13. The apparatus of claim 12, further comprising a first filtering unit to perform filtering on the decoded video data in units of a block using the determined filtering table when the block strength is greater than or equal to 4 to deblock the decoded video data.

14. The apparatus of claim 13, wherein the first filtering unit further comprises:

a table storage unit to store predetermined filtering tables;

a matrix calculation unit to read-out a filtering table corresponding to table information determined by the table determination unit from the table storage unit and to perform matrix calculation on the read-out filtering table and input data to be filtered;

a rounding control unit to add a predetermined value to the matrix-calculated data; and a shift operation unit to shift an output value of the rounding control unit by predetermined bits.

15. A method for a multi-format codec for deblocking decoded video data, the method comprising:

detecting a video compression format of the decoded video data;

determining a block strength indicating a filtering strength as being equal to or less than 4 when the detected video compression format is H.264, and as being equal to 5 when the detected video compression format is WMV-9; and determining a filtering table differently when the block strength is greater than or equal to 4.

16. The method of claim 15, further comprising performing predetermined filtering defined in H.264 when the block strength is less than 4 to deblock the decoded video data.

* * * * *